(12) United States Patent
Wang et al.

(10) Patent No.: US 12,501,758 B2
(45) Date of Patent: Dec. 16, 2025

(54) DISPLAY PANEL AND DISPLAY DEVICE

(71) Applicants: Chuzhou HKC Optoelectronics Technology Co., Ltd., Chuzhou (CN); HKC Corporation Limited, Guangdong (CN)

(72) Inventors: Guangjia Wang, Chuzhou (CN); Haijiang Yuan, Chuzhou (CN)

(73) Assignees: CHUZHOU HKC OPTOELECTRONICS TECHNOLOGY CO., LTD., Chuzhou (CN); HKC CORPORATION LIMITED, Guangdong (CN)

( * ) Notice: Subject to any disclaimer, the term of this patent is extended or adjusted under 35 U.S.C. 154(b) by 475 days.

(21) Appl. No.: 18/089,998

(22) Filed: Dec. 28, 2022

(65) Prior Publication Data

US 2023/0369384 A1  Nov. 16, 2023

(30) Foreign Application Priority Data

May 12, 2022 (CN) .......................... 202210515975.2

(51) Int. Cl.
  *H10H 29/14* (2025.01)
(52) U.S. Cl.
  CPC ................. *H10H 29/142* (2025.01)
(58) Field of Classification Search
  CPC .. H10H 29/142; H10H 20/852; H10H 20/857; H10K 59/18; H10K 59/131;
  (Continued)

(56) References Cited

U.S. PATENT DOCUMENTS 9,142,571 B2 * 9/2015 Tanikame ............ H10K 59/123
2006/0044828 A1 * 3/2006 Kim ................. G02F 1/133615
                                                                                            362/621
(Continued)

FOREIGN PATENT DOCUMENTS

CN     111105720 A     5/2020
CN     111128048 A     5/2020
(Continued)

OTHER PUBLICATIONS

The Notice for the First Trial dated Feb. 3, 2023 received in Chinese Patent Application No. CN 202210515975.2.
(Continued)

*Primary Examiner* — Yasser A Abdelaziz
(74) *Attorney, Agent, or Firm* — Scully, Scott, Murphy & Presser, P.C.

(57) ABSTRACT

A display panel and a display device are provided. The display panel includes multiple sub-panels. The sub-panel includes a first substrate, a first signal-transmission layer disposed on the first substrate, and a light-emitting layer disposed at the first substrate and electrically coupled with the first signal-transmission layer. The display panel further includes a second substrate, a second signal-transmission layer disposed on the second substrate, and multiple conductive transfer members. The second substrate is disposed in correspondence with the multiple sub-panels and disposed opposite to and spaced apart from the first substrate. The multiple of conductive transfer members are disposed at the first substrate, where each conductive transfer member is electrically coupled with the first signal-transmission layer and the second signal-transmission layer.

18 Claims, 8 Drawing Sheets

(58) Field of Classification Search
CPC .... H10K 59/82; G09G 3/32; G09G 2300/026; G09G 2320/0233; H01L 25/0753; H01L 25/167; H05B 45/00
See application file for complete search history.

(56) References Cited

U.S. PATENT DOCUMENTS

| | | | |
|---|---|---|---|
| 2012/0091923 A1* | 4/2012 | Kastner-Jung | H05B 33/22 313/512 |
| 2016/0093241 A1* | 3/2016 | Bastani | G09G 3/002 345/84 |
| 2020/0111391 A1* | 4/2020 | Chao | G02B 6/4298 |
| 2021/0378093 A1 | 12/2021 | Zheng | |
| 2021/0384392 A1 | 12/2021 | Yang et al. | |
| 2022/0058994 A1 | 2/2022 | Tseng et al. | |
| 2023/0363222 A1* | 11/2023 | Shi | H04M 1/0266 |

FOREIGN PATENT DOCUMENTS

| | | |
|---|---|---|
| CN | 111200914 A | 5/2020 |
| CN | 114156286 A | 3/2022 |
| WO | 2022007571 A1 | 1/2022 |
| WO | 2022022125 A1 | 2/2022 |

OTHER PUBLICATIONS

Notice of the Second Review Opinion dated Apr. 13, 2023 received in Chinese Patent Application No. CN 202210515975.2.

* cited by examiner

DISPLAY PANEL AND DISPLAY DEVICE

CROSS-REFERENCE TO RELATED APPLICATIONS

This application claims priority under 35 U.S.C. § 119(a) to Chinese Patent Application No. 202210515975.2, filed May 12, 2022, the entire disclosure of which is incorporated herein by reference.

TECHNICAL FIELD

This disclosure relates to the field of display technology, and particularly to a display panel and a display device.

BACKGROUND

With development of optoelectronic display technology and semiconductor manufacturing technology, display devices equipped with Thin Film Transistors (TFT) are increasingly more developed. Newly emerging Mini Light Emitting Diodes (Mini LED) and Micro LEDs have advantages such as high brightness, high contrast, wide color-gamut, high resolution, quick response, power saving, and low power consumption, and are considered to be a new direction of revolutionary display technology.

In the current related art, a large Mini-LED display panel or Micro-LED display panel is structured by splicing multiple sub-panels. There is a splicing gap between the sub-panels, but such a wide splicing gap will cause a dark line when the entire display panel displays, which seriously affects display quality.

SUMMARY

The disclosure aims to provide a display panel and a display device, which can solve a technical problem of large splicing gaps during splicing of sub-panels.

In a first aspect, a display panel is provided in the disclosure. The display panel includes multiple sub-panels. The sub-panel includes a first substrate, a first signal-transmission layer disposed on the first substrate, and a light-emitting layer disposed at the first substrate and electrically coupled with the first signal-transmission layer. The display panel further includes a second substrate, a second signal-transmission layer disposed on the second substrate, and multiple conductive transfer members. The second substrate is disposed in correspondence with the multiple sub-panels and disposed opposite to and spaced apart from the first substrate. The multiple of conductive transfer members are disposed at the first substrate, where each conductive transfer member is electrically coupled with the first signal-transmission layer and the second signal-transmission layer.

In a second aspect, a display device is provided in the disclosure. The display device includes the display panel of the first aspect and a housing configured to carry the display panel.

BRIEF DESCRIPTION OF THE DRAWINGS

In order to describe technical solutions of implementations of the disclosure more clearly, the following will give a brief introduction to the accompanying drawings used for describing implementations. Apparently, the accompanying drawings described below are merely some implementations of the disclosure. Based on these drawings, those of ordinary skill in the art can also obtain other drawings without creative effort.

Figure 1:
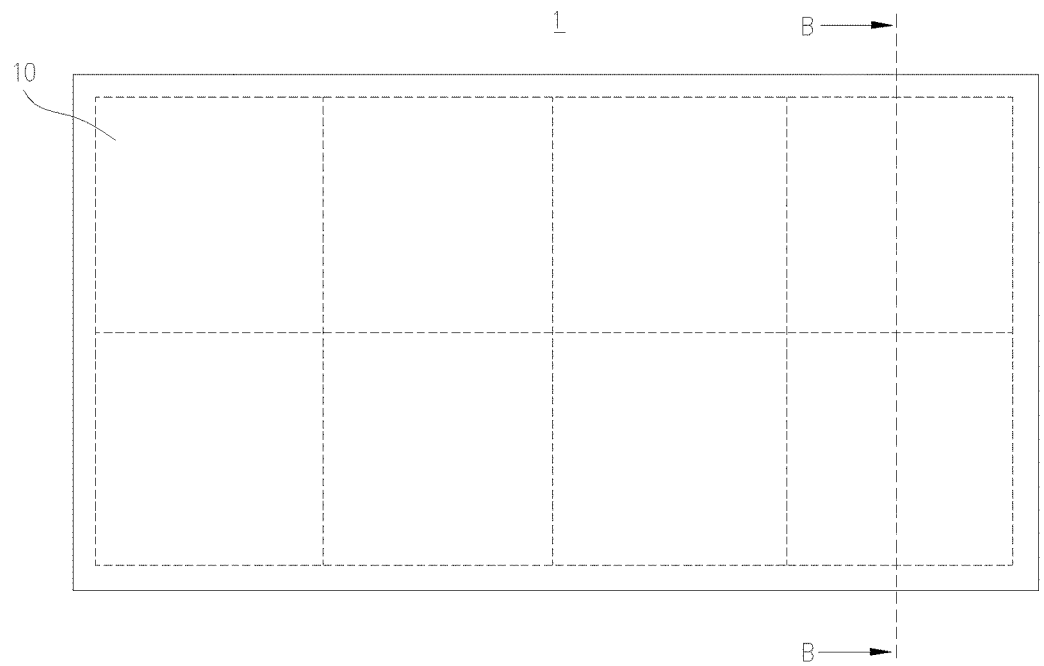
FIG. 1 is a schematic structural view of a display panel provided in implementations of the disclosure.

Reference numbers are described as follows: display panel—1, sub-panel—10, first substrate—11, first signal-transmission layer—12, light-emitting layer—13, second substrate—21, second signal-transmission layer—22, conductive transfer member—30, first transfer member—31, second transfer member—32, device arrangement surface—41, peripheral side-surface—42, first conductive pad—51, second conductive pad—52, first signal line—61, second signal line—62, third signal line—63, fourth signal line—

64, planarization layer—70, insulation layer—80, via hole—81, display device—1000, housing—200.

DETAILED DESCRIPTION

Technical solutions of implementations of the disclosure will be described clearly and completely below with reference to the accompanying drawings of the implementations of the disclosure. Apparently, implementations described herein are merely some implementations, rather than all implementations, of the disclosure. Based on the implementations of the disclosure, all other implementations obtained by those of ordinary skill in the art without creative effort shall fall within the protection scope of the disclosure.

The term "embodiment" or "implementation" referred to herein means that a particular feature, structure, or characteristic described in conjunction with the embodiment or implementation may be contained in at least one embodiment of the disclosure. The phrase appearing in various places in the specification does not necessarily refer to the same embodiment, nor does it refer to an independent or alternative embodiment that is mutually exclusive with other embodiments. It is explicitly and implicitly understood by those skilled in the art that an embodiment described herein may be combined with other embodiments.

It is to be noted that, the terms "first", "second", and the like used in the specification, the claims, and the accompany drawings of the disclosure are used to distinguish different objects rather than describe a particular order. In addition, the terms "include", "comprise", and "have" as well as variations thereof are intended to cover non-exclusive inclusion.

In the specification, for the sake of convenience, terms such as "middle", "upper", "lower", "front", "rear", "vertical", "horizontal", "top", "bottom", "inside", "outside", and the like indicating a directional relationship or positional relationship are used for describing a positional relationship between elements based on the accompanying drawings and are only for the convenience of illustration and simplicity, rather than explicitly or implicitly indicate that apparatuses or components referred to herein must have a certain direction or be structured or operated in a certain direction and therefore cannot be understood as limitation on the disclosure. The positional relationship between elements is appropriately changed according to the directions of the described elements. Therefore, it is not limited to the terms described in the specification, and can be appropriately replaced according to actual needs.

In the specification, unless stated otherwise, terms "installation", "coupling", "connection", and the like should be understood in broader sense. For example, coupling may be a fixed coupling, a removable coupling, or an integrated coupling, may be a mechanical coupling, or an electrical coupling, and may be a direct coupling, an indirect coupling through a medium, or a communication coupling between two components. For those of ordinary skill in the art, the above terms in the disclosure can be understood according to specific situations.

With development of optoelectronic display technology and semiconductor manufacturing technology, display devices equipped with Thin Film Transistors (TFT) are increasingly more developed. For example, TFT Liquid Crystal Displays (TFT-LCD) as well as TFT Organic Light-Emitting Diode (TFT-OLED) displays have been successfully mass-produced. However, newly emerging Mini LEDs and Micro LEDs have advantages such as high brightness, high contrast, wide color-gamut, high resolution, quick response, power saving, and low power consumption, and are considered to be a new direction of revolutionary display technology.

When preparing Mini LEDs and Micro LEDs, it is necessary to transfer countless (millions of, tens of millions of, or hundreds of millions of) LEDs to TFT array substrates, which is called massive transfer. Due to low yield of this process, Mini LED and Micro LED technologies are not well developed. In addition, for this reason, it is more difficult to manufacture large-sized Mini LED display panels and large-sized Micro LED display panels, and therefore, splicing technology is usually adopted to manufacture large-sized Mini LED display panels and large-sized Micro LED display panels.

In the current related art, a large Mini-LED display panel or Micro-LED display panel is structured by splicing multiple sub-panels. There is a splicing gap between the sub-panels. To transmit signals to the sub-panel, the sub-panel needs to be side-bonded. Specifically, a Flexible Printed Circuit (FPC) board is usually disposed at a top surface of the sub-panel and bent to a peripheral side-surface, and then is bent to a bottom surface to connect to a Printed Circuit Board (PCB) on a bottom side. In other words, when two adjacent sub-panels are spliced, a splicing gap between the two adjacent sub-panels is generally larger than 0.1 millimeter (mm) due to thickness of the FPC itself and errors in processing. Such a wide splicing gap will cause a dark line when the entire display panel displays, which seriously affects display quality.

The disclosure aims to provide a display panel and a display device, which can solve a technical problem of large splicing gaps during splicing of sub-panels.

A display panel is provided in the disclosure. The display panel includes multiple sub-panels. The sub-panel includes a first substrate, a first signal-transmission layer disposed on the first substrate, and a light-emitting layer disposed at the first substrate and electrically coupled with the first signal-transmission layer. The display panel further includes a second substrate, a second signal-transmission layer disposed on the second substrate, and multiple conductive transfer members. The second substrate is disposed in correspondence with the multiple sub-panels and disposed opposite to and spaced apart from the first substrate. The multiple of conductive transfer members are disposed at the first substrate, where each conductive transfer member is electrically coupled with the first signal-transmission layer and the second signal-transmission layer.

The first signal-transmission layer and the second signal-transmission layer each are provided with conductive pads. The first signal-transmission layer is provided with first conductive pads, and the second signal-transmission layer is provided with second conductive pads, where the second conductive pads are disposed in correspondence with the first conductive pads. The conductive transfer member is coupled with the first conductive pad and the second conductive pad.

The conductive transfer member includes a first transfer member and a second transfer member. The first signal-transmission layer includes a first signal line and a second signal line that are arranged in cross-insulation, and the second signal-transmission layer includes a third signal line and a fourth signal line that are arranged in cross-insulation. The first signal line is electrically coupled with the third signal line through a corresponding first conductive pad, a corresponding first transfer member, and a corresponding second conductive pad. The second signal line is electrically coupled with the fourth signal line through a corresponding first conductive pad, a corresponding second transfer member, and a corresponding second conductive pad.

The first signal line is electrically coupled with at least one first conductive pad, and the second signal line is electrically coupled with at least one first conductive pad.

The first signal line is electrically coupled with two first conductive pads, and the two first conductive pads electrically coupled with the first signal line are disposed at two opposite sides of the first signal-transmission layer. The second signal line is electrically coupled with two first conductive pads, and the two first conductive pads electrically coupled with the second signal line are disposed at another two opposite sides of the first signal-transmission layer. The two first conductive pads electrically coupled with the second signal line and the two first conductive pads electrically coupled with the first signal line are at different sides of the first signal-transmission layer. Each first conductive pad is electrically coupled with one conductive transfer member, and different first conductive pads are electrically coupled with different conductive transfer members.

The first signal line is electrically coupled with two first conductive pads, and the two first conductive pads electrically coupled with the first signal line are disposed at two opposite sides of the first signal-transmission layer. The second signal line is electrically coupled with two first conductive pads, and the two first conductive pads electrically coupled with the second signal line are disposed at another two opposite sides of the first signal-transmission layer. The two first conductive pads electrically coupled with the second signal line and the two first conductive pads electrically coupled with the first signal line are at different sides of the first signal-transmission layer. For two adjacent first signal-transmission layers, two adjacent first conductive pads that are at different first signal-transmission layers correspond to one conductive transfer member, and the conductive transfer member is coupled with both of the two adjacent conductive pads.

The first signal line is electrically coupled with one first conductive pad, the second signal line is electrically coupled with one first conductive pad, and the one first conductive pad electrically coupled with the second signal line and the one first conductive pad electrically coupled with the first signal line are at different sides of the first signal-transmission layer. Each first conductive pad is electrically coupled with one conductive transfer member, and different first conductive pads are electrically coupled with different conductive transfer members.

The first substrate includes a device arrangement surface and a peripheral side-surface connected with the device arrangement surface in a bendable manner. The device arrangement surface is used for arrangement of the first signal-transmission layer and the light-emitting layer. Peripheral side-surfaces of two adjacent first substrates are abutted against each other. The conductive transfer member is disposed at one side of the device arrangement surface.

An orthographic projection of the first conductive pad on the first substrate covers an orthographic projection of the conductive transfer member on the first substrate, and an orthographic projection of the second conductive pad on the second substrate covers an orthographic projection of the conductive transfer member on the second substrate.

A display device is further provided in the disclosure. The display device includes the display panel and a housing configured to carry the display panel.

In the display panel provided in the disclosure, a driving signal of the sub-panel can be transmitted from the second signal-transmission layer on the second substrate to the first signal-transmission layer of the sub-panel via the conductive transfer member, and then the driving signal will be transmitted to the light-emitting layer that is electrically coupled with the first signal-transmission layer. The second substrate, the second signal-transmission layer, and the conductive transfer member can be arranged along a vertical direction of the sub-panel, such that the driving signal can be transmitted to other sub-panels. Compared with a scheme in the related art in which the sub-panel needs to be side-bonded with a Flexible Printed Circuit (FPC) to obtain a driving signal, in the disclosure, it is possible to further narrow a splicing gap or even realize seamless splicing when splicing the sub-panels of the display panel, thereby improving overall display quality of the display panel.

Figure 2:
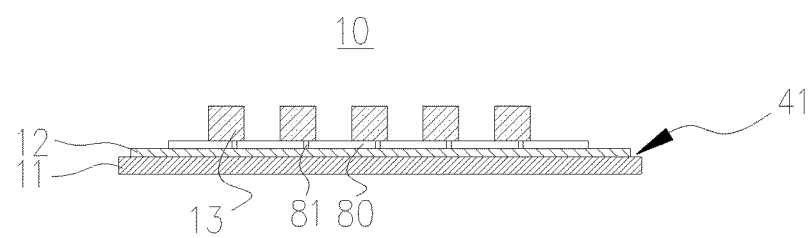
FIG. 2 is a schematic partial cross-sectional view of a sub-panel provided in implementations of the disclosure.
Figure 3:
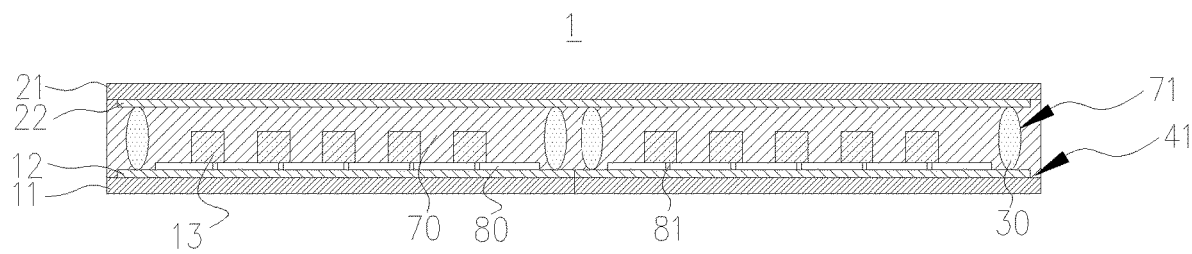
FIG. 3 is a schematic cross-sectional view taken along line B-B in FIG. 1 provided in implementations of the disclosure.

Refer to FIG. 1, which is a schematic structural view of a display panel provided in implementations of the disclosure. The disclosure provides a display panel 1. The display panel 1 includes multiple sub-panels 10. Referring to FIG. 2 and FIG. 3, FIG. 2 is a schematic partial cross-sectional view of a sub-panel provided in implementations of the disclosure, and FIG. 3 is a schematic cross-sectional view taken along line B-B in FIG. 1 provided in implementations of the disclosure. Specifically, the sub-panel 10 includes a first substrate 11, a first signal-transmission layer 12, and a light-emitting layer 13. The first signal-transmission layer 12 is disposed on the first substrate 11. The light-emitting layer 13 is disposed at the first substrate 11 and electrically coupled with the first signal-transmission layer 12. The display panel 1 further includes a second substrate 21, a second signal-transmission layer 22, and multiple conductive transfer members 30. The second substrate 21 is disposed in correspondence with the multiple sub-panels 10 and disposed opposite to and spaced apart from the first substrate 11. In FIG. 2, the number of sub-panels 10 corresponding to the second substrate 21 is two as an example for illustration, which understandably cannot be comprehended as limitation on the display panel provided in implementations of the disclosure. The second substrate 21 may be disposed in correspondence with two, three, or even more sub-panels 10, or may be disposed in correspondence with M*N sub-panels 10 that are arranged in array. The second signal-transmission layer 22 is disposed on the second substrate 21. Each conductive transfer member 30 is disposed at the first substrate 11 and electrically coupled with the first signal-transmission layer 12 and the second signal-transmission layer 22.

Specifically, the second signal-transmission layer 22 on the second substrate 21 is configured to transmit a driving signal of the display panel 1. In this implementation, the multiple sub-panels 10 and the second substrate 21 are stacked and spaced apart. In this implementation, the multiple sub-panels 10 and the second substrate 21 are stacked along a vertical direction. In other words, the multiple sub-panels 10 are disposed below the second substrate 21 along a vertical direction. It is to be noted that, the multiple sub-panels 10 as a whole are stacked with and spaced apart from the second substrate 21. It can be understood that, a positional relationship between the sub-panels 10 and the second substrate 21 depends on a placement manner of the display panel 1. For example, if the display panel 1 is placed vertically, the sub-panels 10 may be located on the left or right of the second substrate 21. The multiple sub-panels 10 each include the first substrate 11, the first signal-transmission layer 12, and the light-emitting layer 13. A driving signal from the second signal-transmission layer 22 is transmitted to the first signal-transmission layer 12 via the conductive transfer member 30. The first signal-transmission layer 12 is electrically coupled with the light-emitting layer 13. The light-emitting layer 13 is driven for light emission according to a driving signal from the first signal-transmission layer 12.

In another implementation, a driving signal from the first signal-transmission layer 12 can be transmitted to the second signal-transmission layer 22 via the conductive transfer member 30.

It is to be noted that, signals may also be transmitted between two sub-panels 10 via a corresponding first signal-transmission layer 12, a corresponding conductive transfer member 30, and a corresponding second signal-transmission layer 22. Specifically, a driving signal from a first signal-transmission layer 12 of one sub-panel 10 is firstly transmitted to a second signal-transmission layer 22 via a conductive transfer member 30, and then transmitted to a first signal-transmission layer 12 of the other sub-panel 10 via another conductive transfer member 30.

Optionally, the driving signal includes, but is not limited to, a driving voltage, a gate driving-signal, a data signal, etc., and the disclosure is not limited in this regard. Similarly, the first signal-transmission layer 12 and the second signal-transmission layer 22 each include, but are not limited to, a driving-voltage signal transmission layer, a gate driving-signal transmission layer, a data signal transmission layer, etc.

It is to be noted that, an orthographic projection of the second substrate 21 along a vertical direction covers orthographic projections of all the multiple sub-panels 10 along a vertical direction, such that the second signal-transmission layer 22 disposed on the second substrate 21 can transmit a driving signal of a driving control circuit to each sub-panel 10.

In this implementation, the first substrate 11 may be a flexible substrate. Optionally, the first substrate 11 may be made of any one or more of the following materials: Polyimide, Polyethylene Terephthalate (PET), Polyethylene Naphthalate Two Formic Acid Glycol Estr (PEN), Cyclo-Olefin polymer (COP), Polycarbonate (PC), Polystyrene (PS), Polypropylene (PP), and Polytetrafluoroethylene (PTFE). In other implementations, the first substrate 11 may also be a non-flexible substrate, such as glass, ceramics, etc. The disclosure is not limited in this regard.

In this implementation, the light-emitting layer 13 is provided with multiple LEDs. Optionally, the LED includes, but is not limited to, an OLED and an inorganic LED. In other implementations, the light-emitting layer 13 may be provided with other light-emitting devices, such as mini LED, micro LED, etc. The disclosure is not limited in this regard.

Optionally, the conductive transfer member 30 is made of a conductive material, such as one or more of gold, silver, copper, and the like. The conductive transfer member 30 is made of a material including but not limited to conductive metals or other conductive materials. The conductive transfer member 30 may be in a shape of one or more of elliptical sphere, cylinder, cuboid, cube, etc., which is not limited in the disclosure. A method for preparing the conductive transfer member 30 will be described below in connection with a method for preparing the display panel 1.

In the display panel 1 provided in the disclosure, a driving signal of the sub-panel 10 can be transmitted between the second signal-transmission layer 22 on the second substrate 21 and the first signal-transmission layer 12 of the sub-panel 10 via the conductive transfer member 30, and then transmitted to the light-emitting layer 13 that is electrically coupled with the first signal-transmission layer 12. The second substrate 21, the second signal-transmission layer 22, and the conductive transfer member 30 can be arranged along a vertical direction of the sub-panel 10, such that the driving signal can be transmitted to other sub-panels 10. Compared with a scheme in the related art in which the sub-panel 10 needs to be side-bonded with an FPC to obtain a driving signal, in the disclosure, it is possible to further narrow a splicing gap or even realize seamless splicing when splicing the sub-panels 10 of the display panel 1, thereby improving overall display quality of the display panel 1.

It is to be noted that, in the related art, in splicing of sub-panels of a display panel, the sub-panel is generally electronically coupled with an FPC before splicing, and as a result, a splicing gap between two adjacent sub-panels is usually larger than 0.1 mm. In contrast, for the sub-panel 10 of the disclosure, the second substrate 21, the second signal-transmission layer 22, and the conductive transfer member 30 can be arranged along a vertical direction of the sub-panel 10 such that a driving signal can be transmitted to other sub-panels 10, and there is no need to provide an FPC. Therefore, in the disclosure, a gap between two adjacent sub-panels 10 spliced is generally smaller than 0.1 mm. Optionally, the gap between two adjacent sub-panels 10 spliced is, but not limited to, 0.01 mm-0.1 mm.

Figure 4:
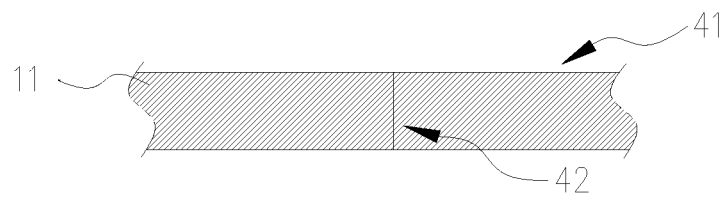
FIG. 4 is a schematic partial cross-sectional view illustrating two adjacent first substrates abutted provided in implementations of the disclosure.

Refer to FIG. 4, which is a schematic partial cross-sectional view illustrating two adjacent first substrates abutted provided in implementations of the disclosure. The first substrate 11 includes a device arrangement surface 41 and a peripheral side-surface 42 connected with the device arrangement surface 41 in a bendable manner. The device arrangement surface 41 is used for arrangement of the first signal-transmission layer 12 and the light-emitting layer 13. Peripheral side-surfaces 42 of two adjacent first substrates 11 are abutted against each other. The conductive transfer member 30 is disposed at one side of the device arrangement surface 41.

Specifically, the peripheral side-surfaces 42 of two adjacent first substrates 11 are abutted against each other (that is, two adjacent sub-panels 10 are abutted against each other). The first signal-transmission layer 12 can receive a driving signal via the conductive transfer member 30 disposed at the device arrangement surface 41. In the display panel 1 of the disclosure, there is no need to dispose a circuit board on a side surface of the first substrate 11 for driving-signal reception. As such, it is possible to avoid a wide gap generated due to existence of a circuit board in splicing of two adjacent sub-panels 10 which will affect display quality, thereby substantially improving overall display quality of the display panel 1.

In order to improve stability of an entire structure of the display panel 1, when splicing two adjacent sub-panels 10, two adjacent first substrates 11 corresponding thereto are fixedly connected. Optionally, the manner of fixed connection includes but is not limited to gluing. Two adjacent first signal-transmission layers 12 in different sub-panels 10 are abutted or not abutted, or disposed in other manners, and the disclosure is not limited in this regard.

Figure 5:
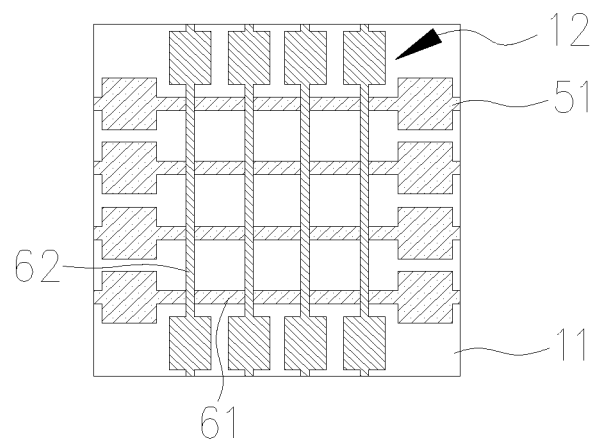
FIG. 5 is a schematic partial structural view of a first signal-transmission layer on a first substrate provided in implementations of the disclosure.
Figure 6:
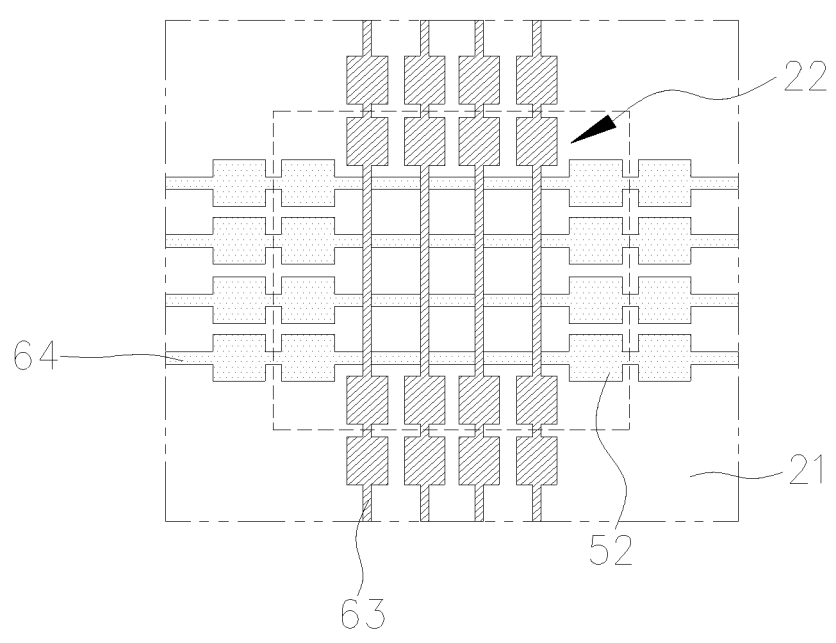
FIG. 6 is a schematic partial structural view of a second signal-transmission layer on a second substrate provided in implementations of the disclosure.

Referring to FIG. 3, FIG. 5, and FIG. 6, FIG. 5 is a schematic partial structural view of a first signal-transmission layer on a first substrate provided in implementations of the disclosure, and FIG. 6 is a schematic partial structural view of a second signal-transmission layer on a second substrate provided in implementations of the disclosure. The first signal-transmission layer 12 and the second signal-transmission layer 22 each are provided with conductive pads. The first signal-transmission layer 12 is provided with first conductive pads 51, and the second signal-transmission layer 22 is provided with second conductive pads 52. The second conductive pads 52 are disposed in correspondence with the first conductive pads 51. The conductive transfer member 30 is coupled with the first conductive pad 51 and the second conductive pad 52.

Specifically, the first conductive pad 51 is disposed at the first signal-transmission layer 12, the second conductive pad 52 is disposed at the second signal-transmission layer 22, and the conductive transfer member 30 is coupled with the first conductive pad 51 and the second conductive pad 52. A driving signal from the second signal-transmission layer 22 can be transmitted to the first signal-transmission layer 12 via the second conductive pad 52, the conductive transfer member 30, and the first conductive pad 51. The first signal-transmission layer 12 is electrically coupled with the light-emitting layer 13. The light-emitting layer 13 is driven for light emission according to a driving signal from the first signal-transmission layer 12.

The second conductive pads 52 are disposed in correspondence with the first conductive pads 51. Optionally, the first conductive pad 51 and the second conductive pad 52 may be sequentially arranged along a vertical direction or the first conductive pad 51 may be staggered relative to the second conductive pad 52, as long as the conductive transfer member 30 can be coupled with each of the first conductive pad 51 and the second conductive pad 52 (that is, to ensure that a driving signal from the second signal-transmission layer 22 can be transmitted to the first signal-transmission layer 12 via the second conductive pad 52, the conductive transfer member 30, and the first conductive pad 51). The disclosure is not limited in this regard.

Optionally, the conductive pad is made of a conductive material, such as gold, silver, copper, and the like. The material of the conductive pad includes but is not limited to conductive metals or other conductive materials. Optionally, the conductive pad may be in a shape of one or more of rhombus, square, rectangle, etc. The disclosure is not limited in this regard.

Figure 7:
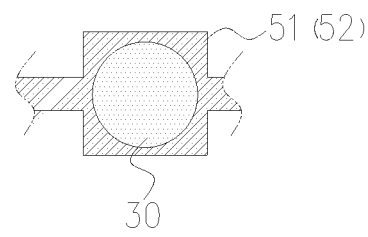
FIG. 7 is a schematic top view of a conductive pad and a conductive transfer member provided in implementations of the disclosure.
Figure 8:
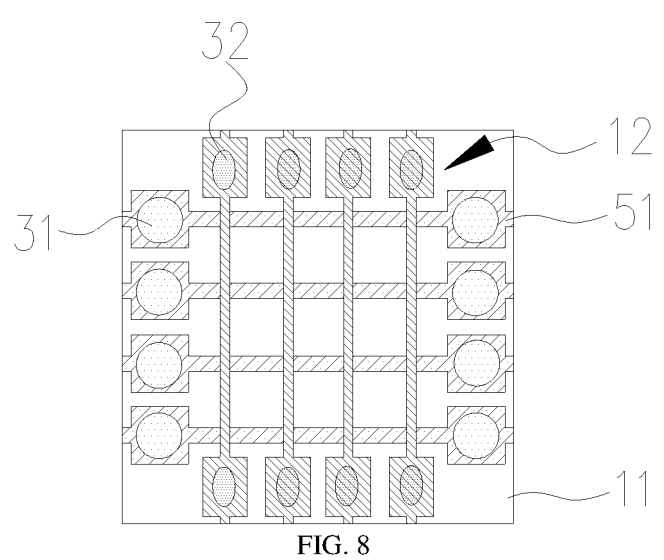
FIG. 8 is a schematic top view of a first signal-transmission layer and conductive transfer members provided in implementations of the disclosure.

Refer to FIG. 7, which is a schematic top view of a conductive pad and a conductive transfer member provided in implementations of the disclosure. An orthographic projection of the first conductive pad 51 on the first substrate 11 covers an orthographic projection of the conductive transfer member 30 on the first substrate 11, and an orthographic projection of the second conductive pad 52 on the second substrate 21 covers an orthographic projection of the conductive transfer member 30 on the second substrate 21.

In order to make a driving signal from the second signal-transmission layer 22 be completely transmitted to the first signal-transmission layer 12 via the conductive transfer member 30, it is necessary to ensure good connections between the conductive transfer member 30 and the first conductive pad 51 and between the conductive transfer member 30 and the second conductive pad 52.

Specifically, in this implementation, if the first conductive pad 51 and the second conductive pad 52 are sequentially arranged along a vertical direction, each of the orthographic projection of the first conductive pad 51 on the first substrate 11 and the orthographic projection of the second conductive pad 52 on the first substrate 11 covers the orthographic projection of the conductive transfer member 30 on the first substrate 11, and accordingly, the orthographic projection of the second conductive pad 52 on the second substrate 21 covers the orthographic projection of the conductive transfer member 30 on the second substrate 21. As such, it is possible to ensure full electrical coupling between the conductive transfer member 30 and the first conductive pad 51 and between the conductive transfer member 30 and the second conductive pad 52, thereby improving stability of the conductive transfer member 30 in driving-signal transmission.

In other implementations, if the first conductive pad 51 and the second conductive pad 52 are sequentially arranged along other inclined directions, an orthographic projection of the first conductive pad 51 covers an orthographic projection of one end of the conductive transfer member 30 that is close to the first conductive pad 51, and an orthographic projection of the second conductive pad 52 covers an orthographic projection of one end of the conductive transfer member 30 that is close to the second conductive pad 52.

Figure 9:
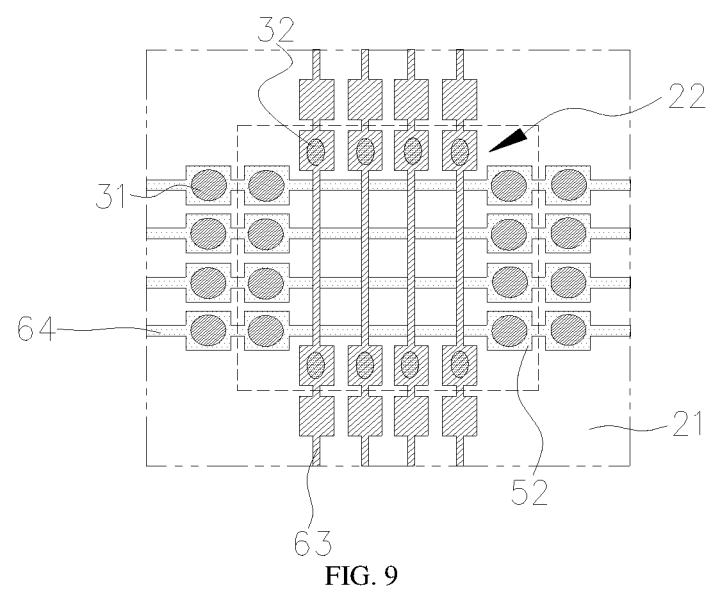
FIG. 9 is a schematic structural view of a second signal-transmission layer and conductive transfer members provided in implementations of the disclosure.
Figure 10:
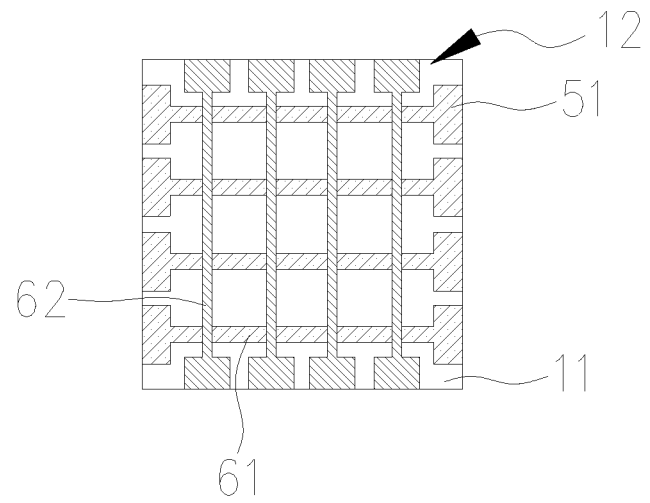
FIG. 10 is a schematic partial structural view of a first signal-transmission layer on a first substrate provided in implementations of the disclosure.

Referring to FIG. 5, FIG. 6, FIG. 8, and FIG. 9, FIG. 8 is a schematic top view of a first signal-transmission layer and conductive transfer members provided in implementations of the disclosure, and FIG. 9 is a schematic structural view of a second signal-transmission layer and conductive transfer members provided in implementations of the disclosure.

The conductive transfer member 30 includes a first transfer member 31 and a second transfer member 32. The first signal-transmission layer 12 includes a first signal line 61 and a second signal line 62 that are arranged in cross-insulation, and the second signal-transmission layer 22 includes a third signal line 63 and a fourth signal line 64 that are arranged in cross-insulation. The first signal line 61 is electrically coupled with the third signal line 63 via a corresponding first conductive pad 51, a corresponding first transfer member 31, and a corresponding second conductive pad 52. The second signal line 62 is electrically coupled with the fourth signal line 64 via a corresponding first conductive pad 51, a corresponding second transfer member 32, and a corresponding second conductive pad 52.

Specifically, the first signal line 61 is electrically coupled with the third signal line 63 via a first conductive pad 51 electrically coupled with the first signal line 61, the first transfer member 31, and a second conductive pad 52 electrically coupled with the third signal line 63. The second signal line 62 is electrically coupled with the fourth signal line 64 via a first conductive pad 51 electrically coupled with the second signal line 62, the second transfer member 32, and a second conductive pad 52 electrically coupled with the fourth signal line 64.

Optionally, the first signal line 61 includes but is not limited to a driving-voltage signal line, a gate signal line, a data signal line, etc. The second signal line 62 includes but is not limited to a driving-voltage signal line, a gate signal line, a data signal line, etc. The third signal line 63 includes but is not limited to a driving-voltage signal line, a gate signal line, a data signal line, etc. The fourth signal line 64 includes but is not limited to a driving-voltage signal line, a gate signal line, a data signal line, etc.

Specifically, the first signal line 61 and the third signal line 63 are of the same transmission type, and the second signal line 62 and the fourth signal line 64 are of the same transmission type. Optionally, the first signal line 61 and the second signal line 62 may be of the same transmission type or different transmission types, and the third signal line 63 and the fourth signal line 64 may be of the same transmission type or different transmission types.

The first signal line 61 and the second signal line 62 are cross-insulated (i.e., intersected and insulated), and the third signal line 63 and the fourth signal line 64 are cross-insulated, which can avoid display disorder of the display panel 1, thereby further improving stability of the display panel 1 in display. The first signal line 61 is electrically coupled with the third signal line 63 via the first conductive pad 51 electrically coupled with the first signal line 61, the first transfer member 31, and the second conductive pad 52 electrically coupled with the third signal line 63. The second signal line 62 is electrically coupled with the fourth signal line 64 via the first conductive pad 51 electrically coupled with the second signal line 62, the second transfer member 32, and the second conductive pad 52 electrically coupled with the fourth signal line 64. Each signal line at the second signal-transmission layer 22 transmits a driving signal to the first signal-transmission layer 12 via a conductive transfer members 30 corresponding to the signal line, which further improves stability in driving-signal transmission, thereby improving a display state of the display panel 1.

Referring to FIG. 5 to FIG. 8, in each first signal-transmission layer 12, the first signal line 61 and the second signal line 62 each are provided with at least one first conductive pad 51. The first signal line 61 is electrically coupled with at least one first conductive pad 51, and the second signal line 62 is electrically coupled with at least one first conductive pad 51.

It is to be noted that, the at least one first conductive pad 51 electrically coupled with the first signal line 61 is insulated from the at least one first conductive pad 51 electrically coupled with the second signal line 62. Optionally, the first conductive pad(s) 51 on the first signal line 61 and the first conductive pad(s) 51 on the second signal line 62 may be staggeredly arranged. In other words, an orthographic projection of the first conductive pad(s) 51 on the first signal line 61 on the first substrate 11 does not overlap with an orthographic projection of the first conductive pad(s) 51 on the second signal line 62 on the first substrate 11.

Specifically, for the first signal-transmission layer 12 of each sub-panel 10, the first signal line 61 and the second signal line 62 each are provided with the first conductive pad(s) 51. Accordingly, the third signal line 63 and the fourth signal line 64 each are provided with the second conductive pad(s) 52. Each first signal line 61 can be electrically coupled with the third signal line 63 via the first conductive pad 51, the conductive transfer member 30, and the second conductive pad 52, and each second signal line 62 can also be electrically coupled with the fourth signal line 64 via the first conductive pad 51, the conductive transfer member 30, and the second conductive pad 52. As such, it is possible to ensure that the first signal-transmission layer 12 and the second signal-transmission layer 22 are fully electrically coupled, such that all driving signals from the second signal-transmission layer 22 can be transmitted to the first signal-transmission layer 12, thereby realizing display via the light-emitting layer 13.

Referring to FIG. 5 to FIG. 8, the first signal line 61 is electrically coupled with two first conductive pads 51, and the two first conductive pads 51 electrically coupled with the first signal line 61 are disposed at two opposite sides of the first signal-transmission layer 12. The second signal line 62 is electrically coupled with two first conductive pads 51, and the two first conductive pads 51 electrically coupled with the second signal line 62 are disposed at another two opposite sides of the first signal-transmission layer 12. The two first conductive pads 51 electrically coupled with the second signal line 62 and the two first conductive pads 51 electrically coupled with the first signal line 61 are at different sides of the first signal-transmission layer 12. Each first conductive pad 51 is electrically coupled with one conductive transfer member 30, and different first conductive pads 51 are electrically coupled with different conductive transfer members 30.

Specifically, the first conductive pads 51 are disposed at both of two opposite ends of the first signal line 61 and both of two opposite ends of the second signal line 62, and each first conductive pad 51 is provided with a different conductive transfer member 30, and corresponding positions on the third signal line 63 and on the fourth signal line 64 (i.e., two opposite ends of the third signal line 63 and two opposite ends of the fourth signal line 64) are also provided with the second conductive pads 52. A driving signal from the third signal line 63 can be transmitted to the two opposite ends of the first signal line 61 via two opposite second conductive pads 52, two opposite first transfer members 31, and two opposite first conductive pads 51. A driving signal from the fourth signal line 64 can be transmitted to the two opposite ends of the second signal line 62 via two opposite second conductive pads 52, two opposite second transfer members 32, and two opposite first conductive pads 51. As such, a driving signal from the second signal-transmission layer 22 can be transmitted faster to the first signal-transmission layer 12, which improves display speed and efficiency of the display panel 1.

Figure 11:
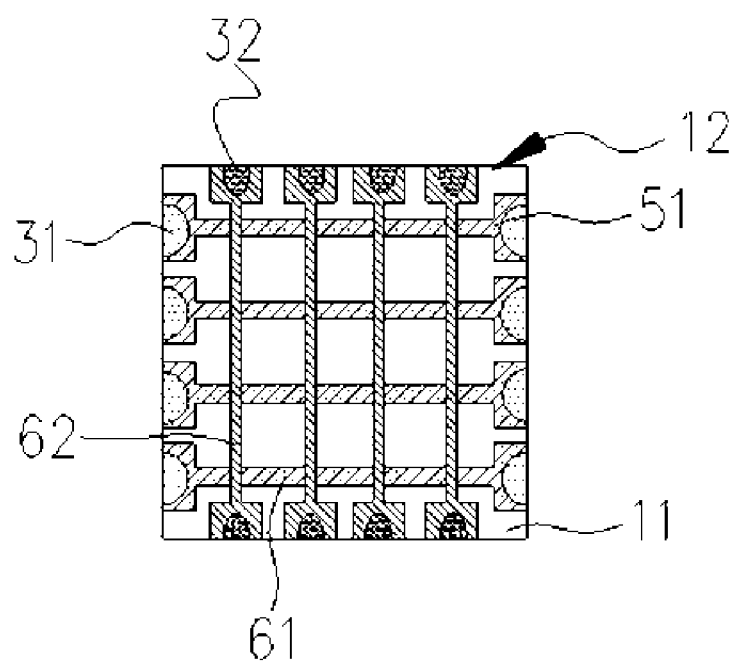
FIG. 11 is a schematic top view of a first signal-transmission layer and conductive transfer members provided in implementations of the disclosure.
Figure 12:
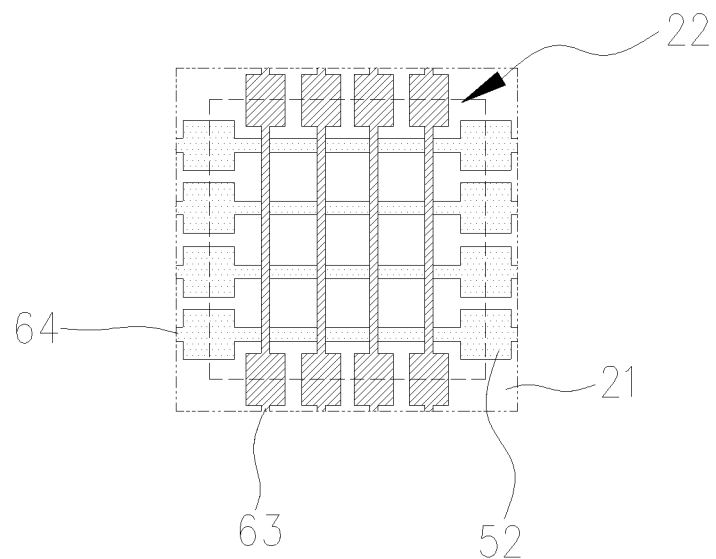
FIG. 12 is a schematic partial structural view of a second signal-transmission layer on a second substrate provided in implementations of the disclosure.
Figure 13:
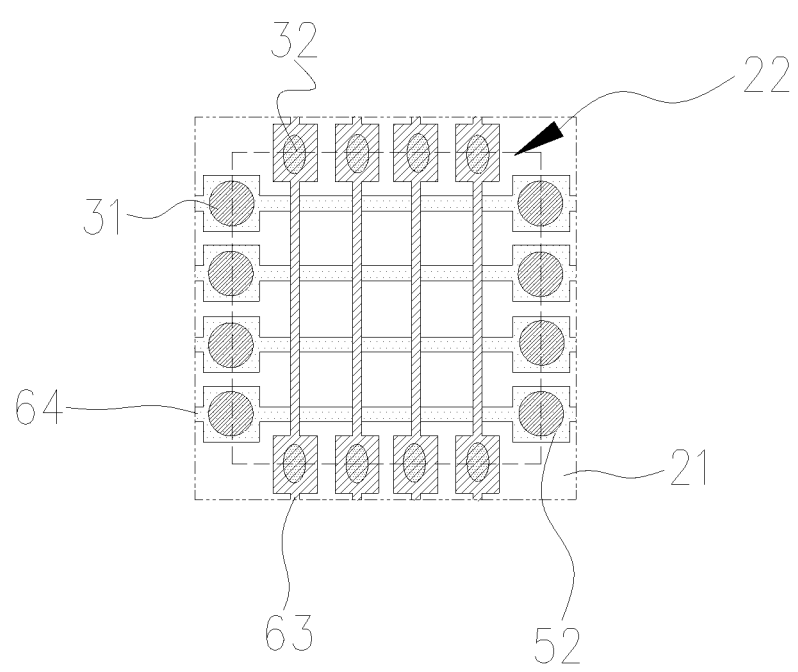
FIG. 13 is a schematic structural view of a second signal-transmission layer and conductive transfer members provided in implementations of the disclosure.
Figure 14:
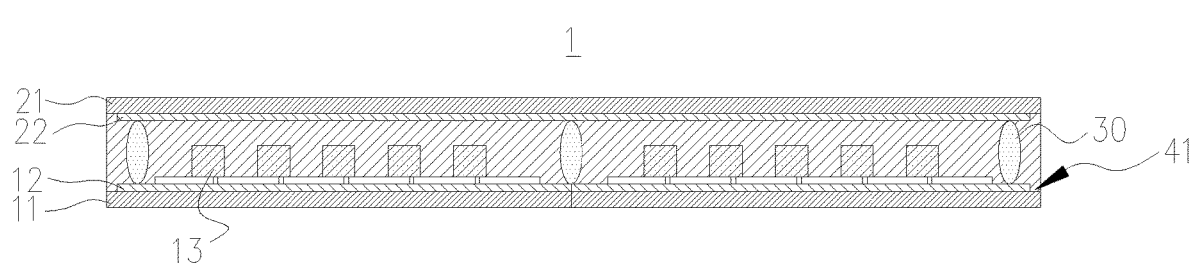
FIG. 14 is a schematic partial cross-sectional view illustrating two spliced sub-panels provided in implementations of the disclosure.
Figure 15:
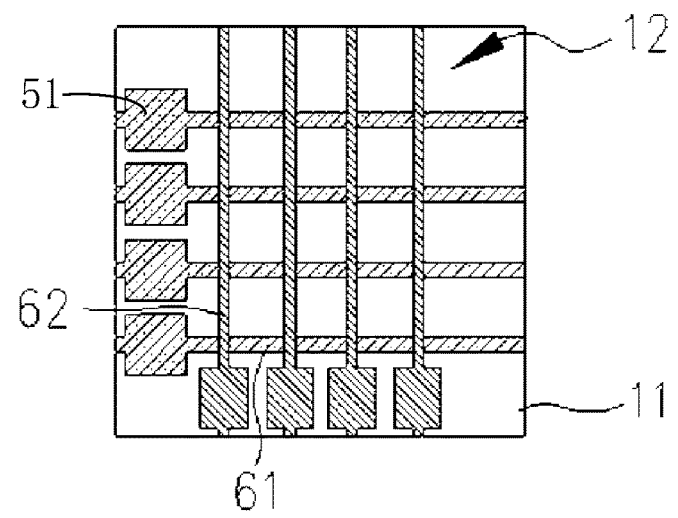
FIG. 15 is a schematic partial structural view of a first signal-transmission layer on a first substrate provided in implementations of the disclosure.

Referring to FIG. 5 to FIG. 14, FIG. 10 is a schematic partial structural view of a first signal-transmission layer on a first substrate provided in implementations of the disclosure, FIG. 11 is a schematic top view of a first signal-transmission layer and conductive transfer members provided in implementations of the disclosure, FIG. 12 is a schematic partial structural view of a second signal-transmission layer on a second substrate provided in implementations of the disclosure, FIG. 13 is a schematic structural view of a second signal-transmission layer and conductive transfer members provided in implementations of the disclosure, and FIG. 14 is a schematic partial cross-sectional view illustrating two spliced sub-panels provided in implementations of the disclosure. In another implementation, the first signal line 61 is electrically coupled with two first conductive pads 51, and the two first conductive pads 51 electrically coupled with the first signal line 61 are disposed at two opposite sides of the first signal-transmission layer 12. The second signal line 62 is electrically coupled with two first conductive pads 51, and the two first conductive pads 51 electrically coupled with the second signal line 62 are disposed at another two opposite sides of the first signal-transmission layer 12. The two first conductive pads 51 electrically coupled with the second signal line 62 and the two first conductive pads 51 electrically coupled with the first signal line 61 are at different sides of the first signal-transmission layer 12. For two adjacent first signal-transmission layers 12, two adjacent first conductive pads 51 that are at different first signal-transmission layers 12 correspond to one conductive transfer member 30, and the conductive transfer member 30 is coupled with both of the two adjacent conductive pads.

Specifically, in the previous implementation, the first conductive pads 51 are disposed at both of two opposite ends of the first signal line 61 and both of two opposite ends of the second signal line 62, and each first conductive pad 51 corresponds to one conductive transfer member 30. In contrast, in this implementation, the first conductive pads 51 are disposed at both of two opposite ends of the first signal line 61 and both of two opposite ends of the second signal line 62, but two adjacent first conductive pads 51 at different first signal-transmission layers 12 are provided with one conductive transfer member 30. As such, it is possible to reduce an area occupied by the conductive transfer members 30 when splicing the multiple sub-panels 10, thereby improving display performance of the display panel 1.

Figure 16:
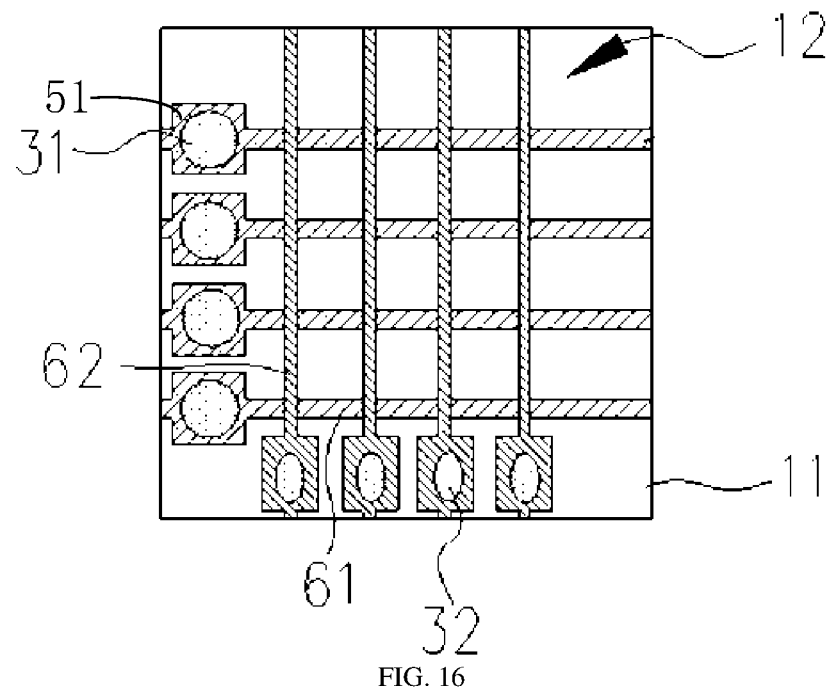
FIG. 16 is a schematic top view of a first signal-transmission layer and conductive transfer members provided in implementations of the disclosure.
Figure 17:
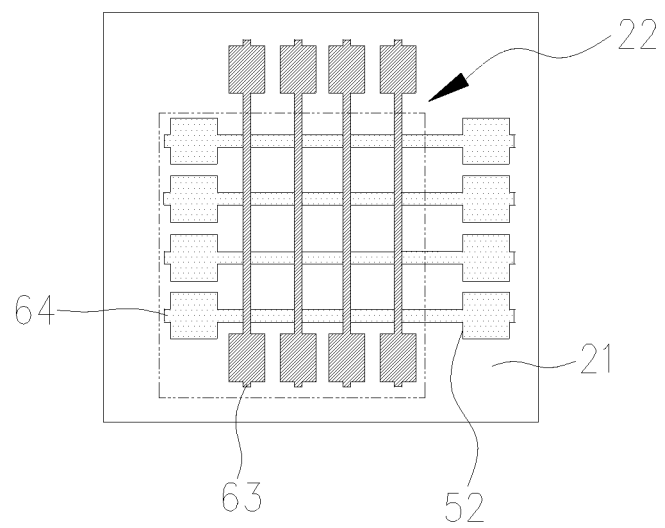
FIG. 17 is a schematic partial structural view of a second signal-transmission layer on a second substrate provided in implementations of the disclosure.
Figure 18:
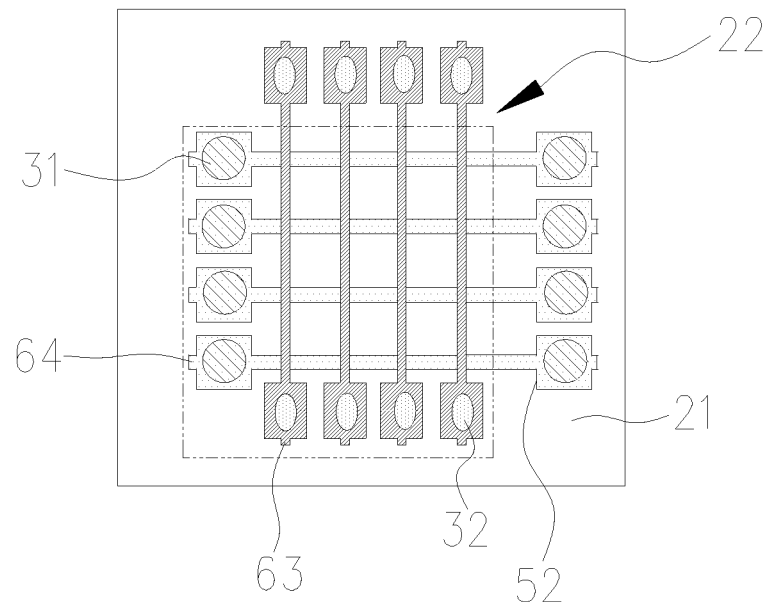
FIG. 18 is a schematic structural view of a second signal-transmission layer and conductive transfer members provided in implementations of the disclosure.

Referring to FIG. 5 to FIG. 18, FIG. 15 is a schematic partial structural view of a first signal-transmission layer on a first substrate provided in implementations of the disclosure, FIG. 16 is a schematic top view of a first signal-transmission layer and conductive transfer members provided in implementations of the disclosure, FIG. 17 is a schematic partial structural view of a second signal-transmission layer on a second substrate provided in implementations of the disclosure, and FIG. 18 is a schematic structural view of a second signal-transmission layer and conductive transfer members provided in implementations of the disclosure. In another implementation, the first signal line 61 is electrically coupled with one first conductive pad 51, and the second signal line 62 is electrically coupled with one first conductive pad 51, where the one first conductive pad 51 electrically coupled with the second signal line 62 and the one first conductive pad 51 electrically coupled with the first signal line 61 are at different sides of the first signal-transmission layer 12. Each first conductive pad 51 is electrically coupled with one conductive transfer member 30, and different first conductive pads 51 are electrically coupled with different conductive transfer members 30.

Specifically, the first signal line 61 and the second signal line 62 each can be provided with only one first conductive pad 51, and the third signal line 63 and the fourth signal line 64 each can also be provided with only one second conductive pad 52. Each first conductive pad 51 is electrically coupled with one different conductive transfer member 30. A driving signal from the third signal line 63 can be transmitted to the first signal line 61 via the second conductive pad 52, the first transfer member 31, and the first conductive pad 51. A driving signal from the fourth signal line 64 can be transmitted to the second signal line 62 via the second conductive pad 52, the second transfer member 32, and the first conductive pad 51.

Only one conductive transfer member 30 is needed for electrical coupling between each first signal line 61 and a third signal line 63 corresponding to the first signal line 61, and only one conductive transfer member 30 is needed for electrical coupling between each second signal line 62 and a fourth signal line 64 corresponding to the second signal line 62. As such, an area occupied by the conductive transfer members 30 when splicing the multiple sub-panels 10 can be further reduced, thereby improving display performance of the display panel 1.

In this implementation, the sub-panel 10 is in a rectangular shape. In other implementations, the shape of the sub-panel 10 may also be rhombus, round, or irregular polygon, etc.

Referring to FIG. 3 again, the sub-panel 10 further includes a planarization layer 70. The planarization layer 70 is disposed on the light-emitting layer 13. The planarization layer 70 can be used for encapsulating the light-emitting layer 13 to insulate the light-emitting layer 13 from outside vapor, thereby preventing the light-emitting layer 13 from being eroded by outside vapor.

In an implementation, the planarization layer 70 defines through holes 71, and the conductive transfer members 30 are disposed in the through holes 71.

Referring to FIG. 2 and FIG. 3 again, the sub-panel 10 further includes an insulation layer 80. The insulation layer 80 is disposed between the light-emitting layer 13 and the first signal-transmission layer 12.

It is to be noted that, the insulation layer 80 defines via holes 81. In this implementation, each via hole 81 is injected with one extension branch of the first signal-transmission layer 12. The first signal-transmission layer 12 transmits a driving signal(s) to the light-emitting layer 13 via extension branches in the via holes 81. In other implementations, the via holes 81 may also be injected with other conductive materials capable of driving-signal transmission. The disclosure is not limited in this regard.

In an implementation, the sub-panel 10 further includes a TFT layer. The TFT layer is disposed at the first substrate 11 and electrically coupled with the light-emitting layer 13.

In this implementation, the sub-panel 10 includes the light-emitting layer 13, and the display panel 1 is an active light-emitting panel. In other implementations, the sub-panel 10 may not have the light-emitting layer 13, and the display panel 1 is a backlight plate. The disclosure is not limited in this regard.

The following will give a brief introduction to a method for preparing the display panel 1. It should be noted that, in this implementation, there are various methods to prepare the display panel 1, and the disclosure is not limited in this regard.

For example, in a first preparation method, each sub-panel 10 is firstly prepared separately. Specifically, after the first substrate 11, the first signal-transmission layer 12, the insulation layer 80, and the light-emitting layer 13 are formed, the conductive transfer member 30 is formed thereon, and the multiple sub-panels 10 thus prepared are spliced. Then the second substrate 21 and the second signal-transmission layer 22 prepared are disposed opposite to and spaced apart from the multiple sub-panels 10. Finally, the planarization layer 70 is filled between the multiple sub-panels 10 and the second substrate 21, thus obtaining the display panel 1.

In a second preparation method, the first substrate 11, the first signal-transmission layer 12, and the insulation layer 80, and the light-emitting layer 13 are sequentially formed. Then multiple first substrates 11 that are each provided with the first signal-transmission layer 12, the insulation layer 80, and the light-emitting layer 13 thereon are spliced. The planarization layer 70 is formed on multiple light-emitting layers 13 on the first substrates 11 spliced. Then the through holes 71 are defined at the planarization layer 70 through lighting or in other manners. The through holes 71 each communicate to the first signal-transmission layer 12, and the conductive transfer members 30 are formed in the through holes 71. The second substrate 21 on which the second signal-transmission layer 22 is formed is attached to the planarization layer 70, and the second signal-transmission layer 22 is closer to the first substrate 11 than the second substrate 21.

Figure 19:
FIG. 19 is a schematic partial structural view of a display device provided in implementations of the disclosure.

Refer to FIG. 19, which is a schematic partial structural view of a display device provided in implementations of the disclosure. The disclosure further provides a display device 1000. The display device 1000 includes the display panel 1 and a housing 200 configured to carry the display panel 1.

Optionally, the housing 200 includes, but is not limited to, a plastic material, a metal material, or other relatively hard materials, so as to protect the display panel 1 to the greatest extent.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A display panel comprising a plurality of sub-panels, and the sub-panel comprising:
   a first substrate;
   a first signal-transmission layer disposed on the first substrate; and
   a light-emitting layer disposed at the first substrate and electrically coupled with the first signal-transmission layer; and
   the display panel further comprising:
      a second substrate disposed in correspondence with the plurality of sub-panels and disposed opposite to and spaced apart from the first substrate;
      a second signal-transmission layer disposed on the second substrate; and
      a plurality of conductive transfer members disposed at the first substrate, wherein each conductive transfer member is electrically coupled with the first signal-transmission layer and the second signal-transmission layer, and wherein the conductive transfer member comprises a first transfer member and a second transfer member, the first signal-transmission layer comprises a first signal line and a second signal line that are arranged in cross-insulation, the second signal-transmission layer comprises a third signal line and a fourth signal line that are arranged in cross-insulation, the first signal line is electrically coupled with the third signal line through a corresponding first conductive pad, a corresponding first transfer member, and a corresponding second conductive pad, and the second signal line is electrically coupled with the fourth signal line through a corresponding first conductive pad, a corresponding second transfer member, and a corresponding second conductive pad.

2. The display panel of claim 1, wherein the first signal-transmission layer and the second signal-transmission layer each are provided with conductive pads, the first signal-transmission layer is provided with first conductive pads, the second signal-transmission layer is provided with second conductive pads, the second conductive pads are disposed in correspondence with the first conductive pads, and the conductive transfer member is coupled with the first conductive pad and the second conductive pad.

3. The display panel of claim 1, wherein the first signal line is electrically coupled with at least one first conductive pad, and the second signal line is electrically coupled with at least one first conductive pad.

4. The display panel of claim 3, wherein
   the first signal line is electrically coupled with two first conductive pads, and the two first conductive pads electrically coupled with the first signal line are disposed at two opposite sides of the first signal-transmission layer;
   the second signal line is electrically coupled with two first conductive pads, and the two first conductive pads electrically coupled with the second signal line are disposed at another two opposite sides of the first signal-transmission layer;
   the two first conductive pads electrically coupled with the second signal line and the two first conductive pads electrically coupled with the first signal line are at different sides of the first signal-transmission layer; and
   each first conductive pad is electrically coupled with one conductive transfer member, and different first conductive pads are electrically coupled with different conductive transfer members.

5. The display panel of claim 3, wherein
   the first signal line is electrically coupled with two first conductive pads, and the two first conductive pads electrically coupled with the first signal line are disposed at two opposite sides of the first signal-transmission layer;
   the second signal line is electrically coupled with two first conductive pads, and the two first conductive pads electrically coupled with the second signal line are disposed at another two opposite sides of the first signal-transmission layer;
   the two first conductive pads electrically coupled with the second signal line and the two first conductive pads electrically coupled with the first signal line are at different sides of the first signal-transmission layer; and
   for two adjacent first signal-transmission layers, two adjacent first conductive pads that are at different first signal-transmission layers correspond to one conductive transfer member, and the conductive transfer member is coupled with both of the two adjacent conductive pads.

6. The display panel of claim 3, wherein
   the first signal line is electrically coupled with one first conductive pad, the second signal line is electrically coupled with one first conductive pad, and the one first conductive pad electrically coupled with the second signal line and the one first conductive pad electrically coupled with the first signal line are at different sides of the first signal-transmission layer; and
   each first conductive pad is electrically coupled with one conductive transfer member, and different first conductive pads are electrically coupled with different conductive transfer members.

7. The display panel of claim 3, wherein the first substrate comprises a device arrangement surface and a peripheral side-surface connected with the device arrangement surface in a bendable manner, the device arrangement surface is used for arrangement of the first signal-transmission layer and the light-emitting layer, peripheral side-surfaces of two adjacent first substrates are abutted against each other, and the conductive transfer member is disposed at one side of the device arrangement surface.

8. The display panel of claim 2, wherein an orthographic projection of the first conductive pad on the first substrate covers an orthographic projection of the conductive transfer member on the first substrate, and an orthographic projection of the second conductive pad on the second substrate covers an orthographic projection of the conductive transfer member on the second substrate.

9. The display panel of claim 2, wherein the sub-panel further comprises a planarization layer, and the planarization layer is disposed on the light-emitting layer and encapsulates the light-emitting layer.

10. A display device comprising a display panel and a housing carrying the display panel, the display panel comprising a plurality of sub-panels and the sub-panel comprising:
   a first substrate;
   a first signal-transmission layer disposed on the first substrate; and
   a light-emitting layer disposed at the first substrate and electrically coupled with the first signal-transmission layer; and
   the display panel further comprising:
      a second substrate disposed in correspondence with the plurality of sub-panels and disposed opposite to and spaced apart from the first substrate;

a second signal-transmission layer disposed on the second substrate; and a plurality of conductive transfer members disposed at the first substrate, wherein each conductive transfer member is electrically coupled with the first signal-transmission layer and the second signal-transmission layer, and wherein the conductive transfer member comprises a first transfer member and a second transfer member, the first signal-transmission layer comprises a first signal line and a second signal line that are arranged in cross-insulation, the second signal-transmission layer comprises a third signal line and a fourth signal line that are arranged in cross-insulation, the first signal line is electrically coupled with the third signal line through a corresponding first conductive pad, a corresponding first transfer member, and a corresponding second conductive pad, and the second signal line is electrically coupled with the fourth signal line through a corresponding first conductive pad, a corresponding second transfer member, and a corresponding second conductive pad.

11. The display device of claim 10, wherein the first signal-transmission layer and the second signal-transmission layer each are provided with conductive pads, the first signal-transmission layer is provided with first conductive pads, the second signal-transmission layer is provided with second conductive pads, the second conductive pads are disposed in correspondence with the first conductive pads, and the conductive transfer member is coupled with the first conductive pad and the second conductive pad.

12. The display device of claim 10, wherein the first signal line is electrically coupled with at least one first conductive pad, and the second signal line is electrically coupled with at least one first conductive pad.

13. The display device of claim 12, wherein
the first signal line is electrically coupled with two first conductive pads, and the two first conductive pads electrically coupled with the first signal line are disposed at two opposite sides of the first signal-transmission layer;
the second signal line is electrically coupled with two first conductive pads, and the two first conductive pads electrically coupled with the second signal line are disposed at another two opposite sides of the first signal-transmission layer;
the two first conductive pads electrically coupled with the second signal line and the two first conductive pads electrically coupled with the first signal line are at different sides of the first signal-transmission layer; and
each first conductive pad is electrically coupled with one conductive transfer member, and different first conductive pads are electrically coupled with different conductive transfer members.

14. The display device of claim 12, wherein
the first signal line is electrically coupled with two first conductive pads, and the two first conductive pads electrically coupled with the first signal line are disposed at two opposite sides of the first signal-transmission layer;
the second signal line is electrically coupled with two first conductive pads, and the two first conductive pads electrically coupled with the second signal line are disposed at another two opposite sides of the first signal-transmission layer;
the two first conductive pads electrically coupled with the second signal line and the two first conductive pads electrically coupled with the first signal line are at different sides of the first signal-transmission layer; and
for two adjacent first signal-transmission layers, two adjacent first conductive pads that are at different first signal-transmission layers correspond to one conductive transfer member, and the conductive transfer member is coupled with both of the two adjacent conductive pads.

15. The display device of claim 12, wherein
the first signal line is electrically coupled with one first conductive pad, the second signal line is electrically coupled with one first conductive pad, and the one first conductive pad electrically coupled with the second signal line and the one first conductive pad electrically coupled with the first signal line are at different sides of the first signal-transmission layer; and
each first conductive pad is electrically coupled with one conductive transfer member, and different first conductive pads are electrically coupled with different conductive transfer members.

16. The display device of claim 12, wherein the first substrate comprises a device arrangement surface and a peripheral side-surface connected with the device arrangement surface in a bendable manner, the device arrangement surface is used for arrangement of the first signal-transmission layer and the light-emitting layer, peripheral side-surfaces of two adjacent first substrates are abutted against each other, and the conductive transfer member is disposed at one side of the device arrangement surface.

17. The display device of claim 11, wherein an orthographic projection of the first conductive pad on the first substrate covers an orthographic projection of the conductive transfer member on the first substrate, and an orthographic projection of the second conductive pad on the second substrate covers an orthographic projection of the conductive transfer member on the second substrate.

18. The display device of claim 10, wherein the sub-panel further comprises a planarization layer, and the planarization layer is disposed on the light-emitting layer and encapsulates the light-emitting layer.

* * * * *